US006245636B1

(12) United States Patent
Maszara

(10) Patent No.: US 6,245,636 B1
(45) Date of Patent: Jun. 12, 2001

(54) METHOD OF FORMATION OF PSEUDO-SOI STRUCTURES WITH DIRECT CONTACT OF TRANSISTOR BODY TO THE SUBSTRATE

(75) Inventor: Witold P. Maszara, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/421,639

(22) Filed: Oct. 20, 1999

(51) Int. Cl.[7] .......................... H01L 21/76; H01L 21/311
(52) U.S. Cl. .......................... 438/411; 438/407; 438/702; 438/149
(58) Field of Search ...................... 438/149, 151, 438/152, 479, 517, 214, 319, 411, 702, 461, 661, 619, 407

(56) References Cited

U.S. PATENT DOCUMENTS

| | | |
|---|---|---|
| 4,571,609 | 2/1986 | Hatano . |
| 4,682,407 * | 7/1987 | Wilson et al. .......................... 29/576 |
| 4,683,637 | 8/1987 | Varker et al. . |
| 4,888,300 * | 12/1989 | Burton .................................. 437/61 |
| 5,097,312 | 3/1992 | Bayraktaroglu . |
| 5,262,346 | 11/1993 | Bindal et al. .......................... 437/62 |
| 5,324,671 | 6/1994 | Bayraktaroglu . |
| 5,391,503 | 2/1995 | Miwa et al. ............................ 437/31 |
| 5,401,998 | 3/1995 | Chiu et al. ........................... 257/368 |
| 5,466,630 * | 11/1995 | Lur ........................................ 437/62 |
| 5,489,762 | 2/1996 | Hu et al. .............................. 257/347 |
| 5,494,837 | 2/1996 | Subramanian et al. ............... 437/40 |
| 5,543,338 | 8/1996 | Shimoji ................................ 437/41 |
| 5,618,345 | 4/1997 | Saitoh et al. ........................... 216/2 |
| 5,620,912 | 4/1997 | Hwang et al. ....................... 438/301 |
| 5,674,760 | 10/1997 | Hong .................................... 437/24 |
| 5,683,932 | 11/1997 | Bashir et al. .......................... 437/67 |
| 5,702,989 | 12/1997 | Wang et al. ......................... 438/397 |
| 5,801,397 | 9/1998 | Cunningham . |
| 5,804,856 | 9/1998 | Ju . |

(List continued on next page.)

FOREIGN PATENT DOCUMENTS 0 480 373 A2    10/1991  (EP) .

OTHER PUBLICATIONS

S. Wolf and R.N. Tauber, Silicon Processing for the VLSi Era, vol. 1 pg. 531, 1986.*

Primary Examiner—Olik Chaudhuri
Assistant Examiner—Shrinivas H. Rao
(74) Attorney, Agent, or Firm—Renner, Otto, Boisselle & Sklar, LLP

(57) ABSTRACT

A method for processing a semiconductor wafer transforms the wafer into one which has a plurality of surface semiconductor platforms for formation of integrated circuit elements thereupon. The platforms are connected to a subsurface bulk layer of semiconductor material via integrally-formed bridges of semiconductor material. The platforms are otherwise surrounded with an electrically-insulating material, thereby providing good insulation between adjacent of the platforms. The method includes the steps of placing a mask on a wafer surface of the wafer, forming a subsurface altered material beneath portions of the wafer surface not covered by the mask, creating exposure openings through the wafer surface to expose a portion of the subsurface altered material, selectively removing the subsurface altered material by selective etching, and filling the subsurface regions and the exposure openings with an electrically-insulating material. In an exemplary embodiment the mask includes a plurality of gate conductors. The wafer surface is bombarded with boron ions to create a subsurface boron-doped material, and the boron-doped material is removed using an appropriate selective etchant.

23 Claims, 4 Drawing Sheets

U.S. PATENT DOCUMENTS

| | | | |
|---|---|---|---|
| 5,811,855 | 9/1998 | Tyson et al. . | |
| 5,825,696 | 10/1998 | Hidaka et al. . | |
| 5,846,857 | 12/1998 | Ju . | |
| 5,877,046 | 3/1999 | Yu et al. | 438/151 |
| 5,879,975 | 3/1999 | Karlsson et al. . | |
| 5,894,152 | 4/1999 | Jaso et al. | 257/347 |
| 5,907,768 | 5/1999 | Malta et al. | 438/105 |
| 5,963,789 | 10/1999 | Tsuchiaki . | |
| 5,972,758 * | 10/1999 | Liang | 438/294 |
| 5,976,945 | 11/1999 | Chi et al. | 438/386 |
| 5,977,579 | 11/1999 | Noble | 257/302 |
| 6,004,864 | 12/1999 | Huang et al. | 438/433 |
| 6,008,104 | 12/1999 | Schrems | 438/386 |
| 6,066,527 | 5/2000 | Kudelka et al. | 438/243 |

* cited by examiner

METHOD OF FORMATION OF PSEUDO-SOI STRUCTURES WITH DIRECT CONTACT OF TRANSISTOR BODY TO THE SUBSTRATE

BACKGROUND OF THE INVENTION

1. Technical Field of the Invention

The present invention relates generally to semiconductor devices and more specifically to methods for forming a semiconductor substrate having electrically isolated surface regions.

2. Description of the Prior Art

Conventional bulk semiconductor devices are formed in semiconductor material by implanting wells of P-type or N-type material in a wafer of the other type of material. Gates and source-drain areas may then be manufactured on the wafer using well-known processes. The resulting devices are known as metal oxide semiconductor (MOS) field effect transistors (MOSFETs). Each device must be electrically isolated from others on the same circuit in order to avoid unwanted connections in the circuits. A relatively large amount of surface area is needed for the electrical isolation of the various MOSFETs. This large amount of surface area devoted to isolation is undesirable in view of the trend toward reduced size of integrated circuits and greater density of elements on integrated circuits. Prior methods of electrically isolating semiconductor integrated transistors from one another have included laterally isolating active regions using insulating material. Two methods of forming the insulating material are (1) selective oxidation of wafer semiconductor material surrounding the active regions by processes such as low temperature oxidation (LTO) or local oxidation of silicon (LOCOS) and (2) deposit of insulating material in trenches formed around the active regions. Such techniques are of limited applicability in that they form insulating material only in relatively shallow regions around the active regions.

Another method that has been utilized is silicon-on-insulator (SOI) isolation techniques. In SOI techniques active areas are formed on an insulating substrate or layer, thereby providing more complete insulation between adjacent active areas of an integrated circuit. However, SOI techniques suffer from problems such as dynamic floating body effects. Floating body effects occur when the body of a device is not connected to a fixed potential and therefore the device takes on a charge based on the history of the device. This can be particularly detrimental in devices such as dynamic random access memory (DRAM) devices where it is critical that a pass transistor stays in an "off" condition to prevent charge leakage from a storage capacitor.

Accordingly, from the above it is seen that there is a need for devices that provide good electrical isolation such as SOI devices without the undesirable drawback of floating body effects.

SUMMARY OF THE INVENTION

A method for processing a semiconductor wafer transforms the wafer into one which has a plurality of surface semiconductor platforms for formation of integrated circuit elements thereupon. The platforms are connected to a subsurface bulk layer of semiconductor material via integrally-formed bridges of semiconductor material. The platforms are otherwise surrounded with an electrically-insulating material, thereby providing good insulation between adjacent of the platforms. The method includes the steps of placing a mask on a wafer surface of the wafer, forming a subsurface altered material beneath portions of the wafer surface not covered by the mask, creating exposure openings through the wafer surface to expose a portion of the subsurface altered material, selectively removing the subsurface altered material by selective etching, and filling the subsurface regions and the exposure openings with an electrically-insulating material. In an exemplary embodiment the mask includes a plurality of gate conductors, and the wafer surface is bombarded with boron ions to create a subsurface boron-doped material, the boron-doped material being removed using an appropriate selective etchant.

According to one aspect of the invention, a method of processing a semiconductor wafer includes forming an altered material in a subsurface region under part of a wafer surface of the wafer, and selectively removing the altered material.

According to another aspect of the invention, a method of processing a semiconductor wafer includes using gate conductors formed on a wafer surface of the wafer as a mask to protect portions of the wafer surface from ion bombardment.

According to yet another aspect of the invention, a method of processing a semiconductor wafer includes lateral etching of a subsurface region accessible through one or more exposure openings.

According to a further aspect of the invention, a method of processing a semiconductor wafer includes the steps of forming an altered material in subsurface region within the wafer; exposing a portion of the altered material by removing a portion of a surface layer between the subsurface region and a wafer surface to create exposure openings; and selectively removing through the exposure opening the altered material from at least a portion of the subsurface region which underlies a remaining portion of the surface layer.

According to a still further aspect of the invention, a method of forming a semiconductor device includes the steps of depositing an electrically active element on a surface of a semiconductor wafer, and using the electrically active element as a mask to block ion implantation through the portion of the surface covered by the electrically active element.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
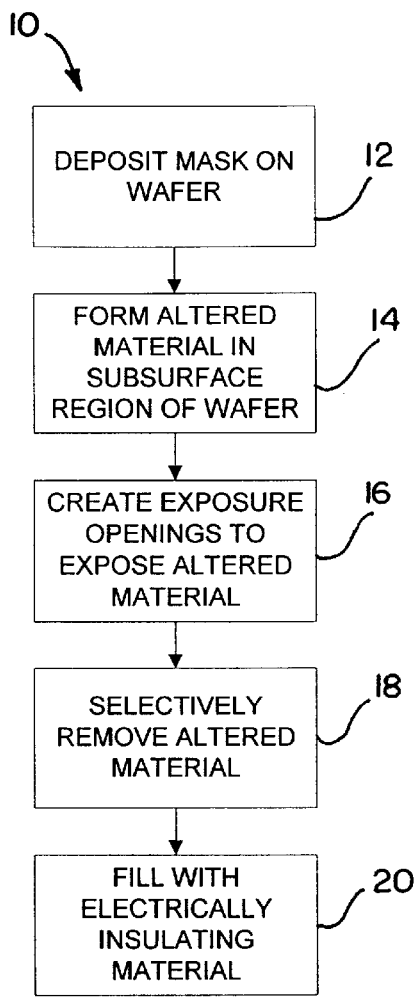
FIG. 1 is a flow chart illustrating the steps of a method in accordance with the present invention.

Referring now to the accompanying drawings, and initially to FIG. 1, a flow chart for a method 10 of processing a semiconductor wafer is shown. The method 10 provides a method for producing a semiconductor wafer with semiconductor platforms which are substantially electrically isolated from one another. The platforms, however, maintain an electrical connection to an underlying bulk semiconductor layer. Thus integrated circuit elements built upon the platform do not suffer from undesirable floating body effects which may occur in silicon on insulator (SOI) devices.

Briefly outlining the method 10, with further details of the individual steps given below, a mask is deposited, formed, or otherwise placed upon a wafer in step 12. The immediate use of the mask is to control the location of the implantation in step 14 of materials in a subsurface region of the wafer. The altered material in the subsurface region formed as the result of implantation will be removed later in the process 10 and replaced with an electrically insulated material. Therefore the material formed in the subsurface region is preferably susceptible to being selectively removed while leaving behind the unaltered material of the semiconductor wafer.

Following the implantation, a portion of the altered material in the subsurface region is exposed in step 16 by removing portions of the semiconductor material between the subsurface region and the surface of the wafer through which implantation was effected. Preferably this exposure is done by making trenches between the surface of the wafer and the subsurface region, the trenches preferably surrounding individual elements of the mask so as to form separate platforms of semiconductor material for each of the mask elements. The altered material in the subsurface regions is thereafter selectively removed in step 18. As described further below, this may be done by selective etching of the altered material. Finally, in step 20 the subsurface regions and the trenches or other connections between the subsurface regions and the wafer surface are filled with an electrically insulating material. The electrically-insulated material may be polished following the filling.

The method 10 therefore produces a semiconductor device having a plurality of semiconductor platforms, the platforms being substantially electrically isolated from one another while still maintaining an electrical connection to the bulk of the wafer. Semiconductor devices may be built upon the resulting wafer in a manner similar to that of conventional wafers, with allowances of course being made for the presence of the plurality of platforms.

Figure 3:
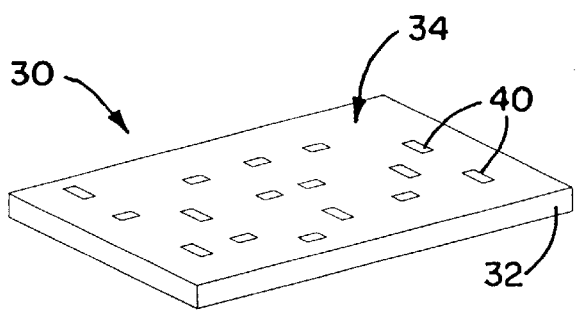
FIGS. 2 and 3 are side sectional and perspective views, respectively, illustrating the mask placement step of the method of FIG. 1.
Figure 2:
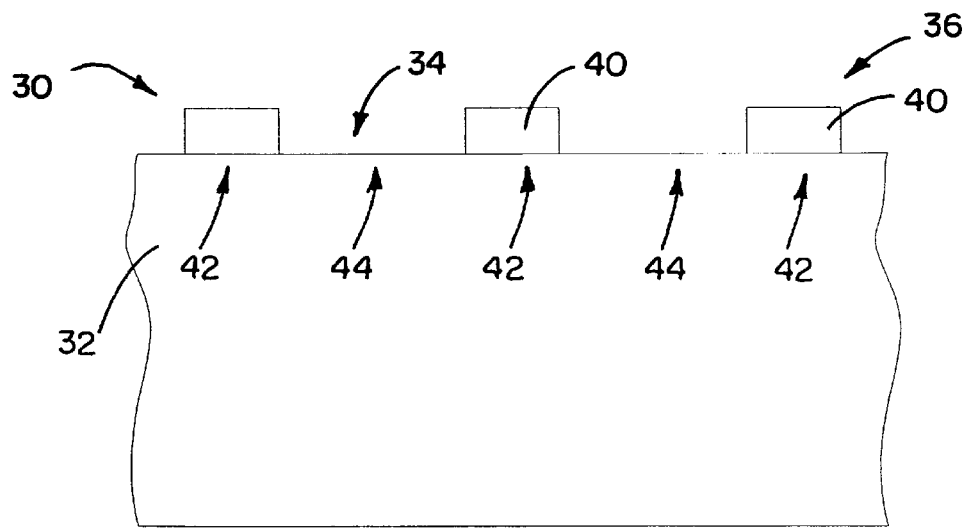

Now examining the above-described method in greater detail, FIGS. 2 and 3 illustrate the mask placement of step 12. A semiconductor device 30 includes a wafer 32. The wafer may be composed of silicon or another suitable semiconductor material. The wafer 32 has a wafer surface 34 upon which a mask 36 is deposited, formed, or otherwise overlaid. The mask 36 includes a plurality of discrete, separate mask elements 40. The mask 36 divides the wafer surface 34 into mask overlay or covered portions 42 which are covered by the mask elements 40, and open portions 44 which are uncovered.

The mask 36 functions to block implantation of ions or other alterations of material through the mask overlay portions 42. The mask elements may include parts or entire electrically-active elements which are to form part of the integrated circuit which is ultimately to be formed on the wafer. For example, some or all of the mask elements may be gate conductors, i.e., a conductor layer such as polysilicon on top of an oxide layer. Methods of forming electrically active elements such as gate conductors are well-known in the art. An advantage to using the electrical elements as mask elements for controlling the subsequent implantation step is that the electrical elements will be accurately located on the semiconductor platforms that will be ultimately created by the method.

Alternatively it will be appreciated that other types of mask elements may be used. For example, photoresist may be deposited on the wafer surface of the wafer. The photoresist may be patterned, with the exposed or unexposed portions of the photoresist removed by well-known methods to leave mask elements made of photoresist on the wafer. Such mask elements may be removed later in the method, after fulfillment of their usefulness in protecting the mask overlay portions from implantation.

It will be appreciated that mask elements which are to be part of the final integrated circuit may be combined with elements which are to be removed later in the processing. It will be further appreciated that a single mask element may include both permanent and removable portions. For example, two permanent electrically active elements may be linked by a removable portion to form a single mask element.

It will be appreciated that the mask elements may vary in size, shape, and height. Spacing of the mask elements may be regular or irregular, and the elements may have complex shapes, if desired.

Figure 4:
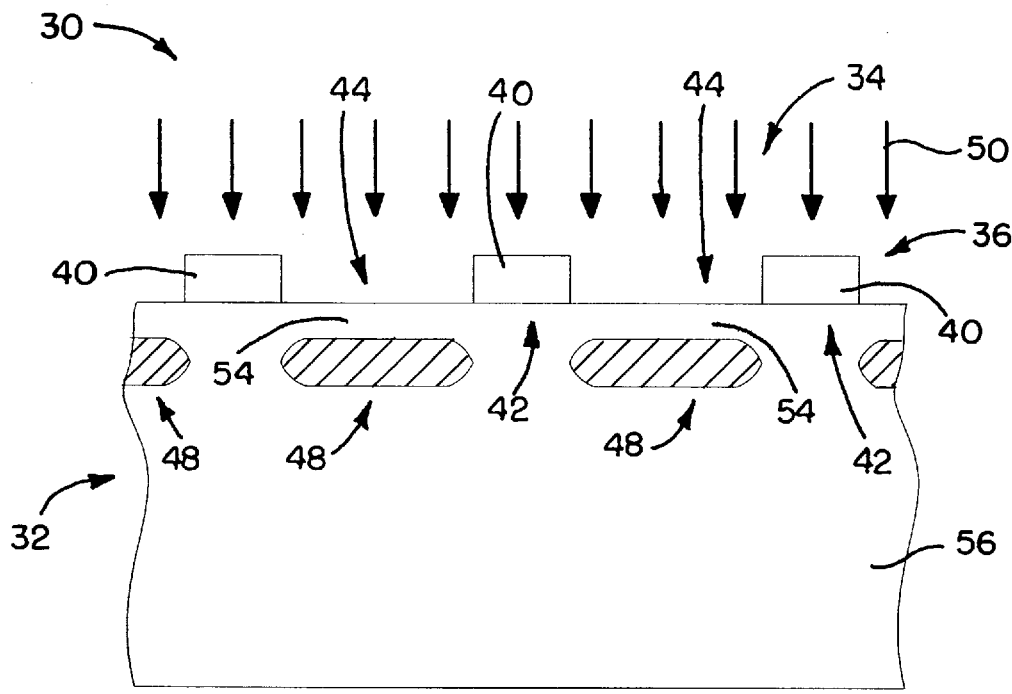
FIG. 4 is a side sectional view illustrating the step of the method of FIG. 1 of forming an altered subsurface material.

FIG. 4 illustrates step 14, the forming of an altered subsurface material in a subsurface region 48 within the wafer 32. An ion source bombards the device 30 with ions 50. Ions which are incident on the mask elements 40 are blocked from reaching the wafer 32. However, ions which are incident on the open portions 44 of the wafer surface 34 are implanted in the wafer 32 to form a high impurity concentration layer below the surface of the wafer 32. Thus altered material is formed in the subsurface region. The depth and thickness of the subsurface region or regions are functions of the type of ions, the semiconductor material of the wafer, and the energy at which the ion bombardment takes place. For example boron ions having an energy of several hundred to several thousand keV incident upon a silicon wafer may be implanted to a depth of several pm (approximately 0.5–10 $\mu$m). Methods for bombarding with ions are well-known in the art.

The subsurface region 48 defines a surface layer 54 of semiconductor material between the subsurface region 48 and the open portions 44 of the wafer surface 34. The subsurface region 48 separates the surface layer 54 from a bulk layer 56 of the wafer 32.

It will be appreciated that the ion bombardment may be perpendicular to the wafer surface or at another angle to the wafer surface. It will be appreciated that a wide variety of materials may be used to alter the semiconductor material of the substrate so that it may be selectively removed relative to the semiconductor material. For example the implanted material could be an element that serves as a P+ type doping source. In addition to boron, such doping sources include other group IIIA elements such as aluminum, gallium, and thallium. An exemplary alternative material would be silicon dioxide doped with boron to a peak concentration of $10_{20}$ atoms per $cm^3$.

In addition to doping, it may be possible to form an altered material by chemically combining semiconductor material of the wafer with an implanted material, in a method similar or analogous to a SIMOX process. However, post-implantation annealing is often a necessary part of formation of chemically-altered (as opposed to doped) subsurface materials. Such annealing may induce stresses in the wafer because of the non-uniform implantation due to the presence of the mask on the wafer surface. The undesirability of stressing the wafer therefore may limit the temperature and/or the duration of such annealing.

Figure 5:
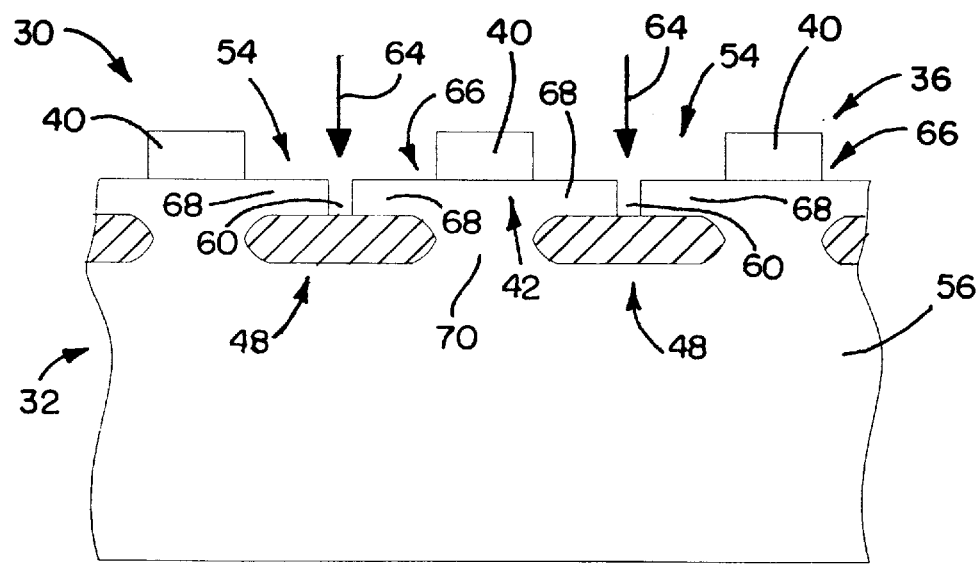
FIGS. 5 and 6 are side sectional and plan views, respectively, illustrating the exposure opening formation step of the method of FIG. 1.
Figure 6:
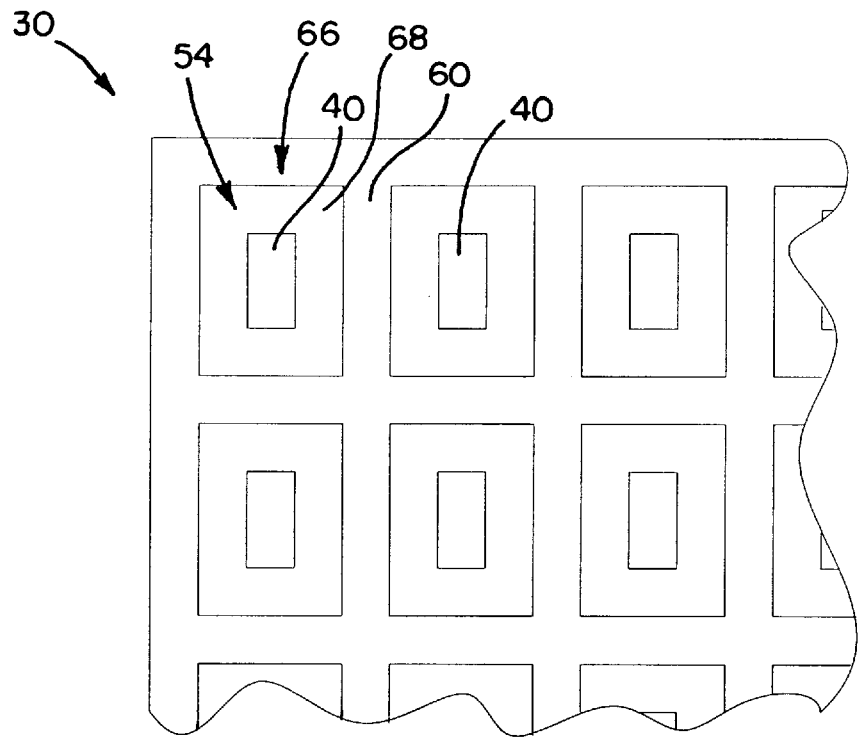

FIGS. 5 and 6 illustrate step 16 of the process 10, exposing a portion of the altered material in the subsurface region 48. Exposure openings such as trenches 60 are made by removing a portion of the surface layers 54 to allow access to the subsurface regions 48. The trenches 60 are preferably made by an anisotropic etch process in the direction 64. The trenches may be made by a dry etch process such as plasma etching, ion milling, reactive ion etching, reactive ion beam etching, or by other processes suitable for carrying out the invention.

The trenches 60 surround and define semiconductor platforms 66. The platforms 66 include areas under the mask overlay portions 42, as well as remaining portions 68 of the surface layers 54 not removed by the exposing of step 16. The platforms 66 each correspond to a respective one of the mask elements 40. Since each of the platforms 66 is surrounded by one or more of the trenches 60, the platforms 66 are not in direct contact with one another along the wafer surface 34. However, the platforms 66 maintain contact with the bulk layer 56 of the wafer 32 via respective platform-bulk bridges 70. It will be appreciated that the bulk layer 56, the platforms 66, and the bridges 70 are formed as an integral unit out of the semiconductor material of the wafer 32.

It will be appreciated that the exposure openings may alternatively be holes and/or channels instead of and/or in addition to trenches. It will further be appreciated that the exposure openings may be made such that some or all of the semiconductor platforms include multiple mask elements.

Figure 7:
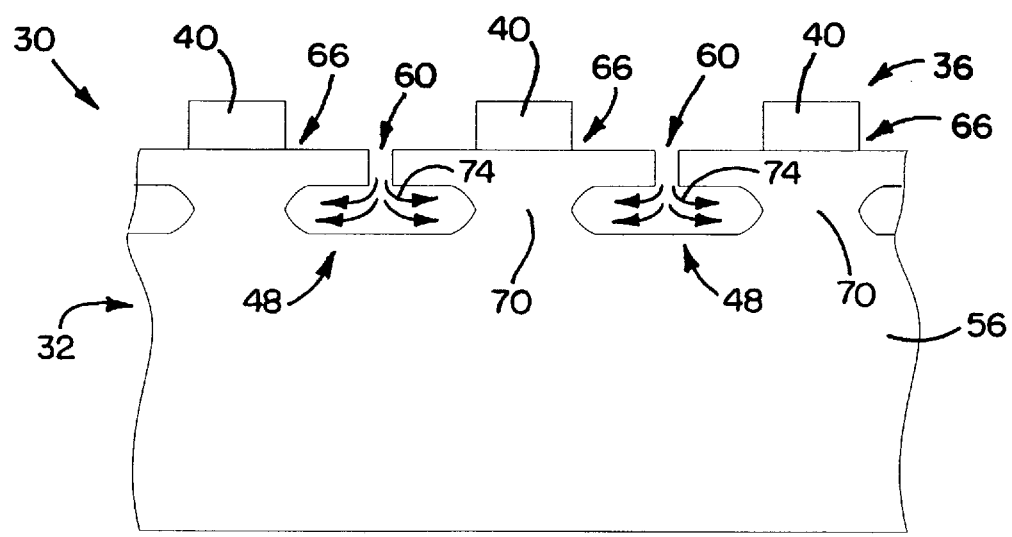
FIG. 7 is a side sectional view illustrating the step of the method of FIG. 1 of selective removing of subsurface altered material.

Turning now to FIG. 7, illustrated therein is step 18 of the method 10, selective removal of the subsurface altered material from the subsurface region 48. As indicated in FIG. 7 by arrows 74 the altered material is removed using the access created to the subsurface regions 48 by the formation of the trenches 60. The removal may be accomplished by use of a wet etch using an etchant that removes the altered material in preference to the unaltered semiconductor material of the wafer 32. As indicated by the arrows 74 the selective removal is primarily directionally lateral. It will be appreciated that following this step each of the platforms 66 is supported only by its respective bridge 70. Therefore the bridges 70 preferably have sufficient strength to support the platforms 66.

An exemplary suitable wet etchant is a mixture of one part HF, three parts $H_2NO_3$, and eight parts $H_2O$. Such an etchant selectively removes borondoped silicon in preference to crystalline silicon.

Figure 8:
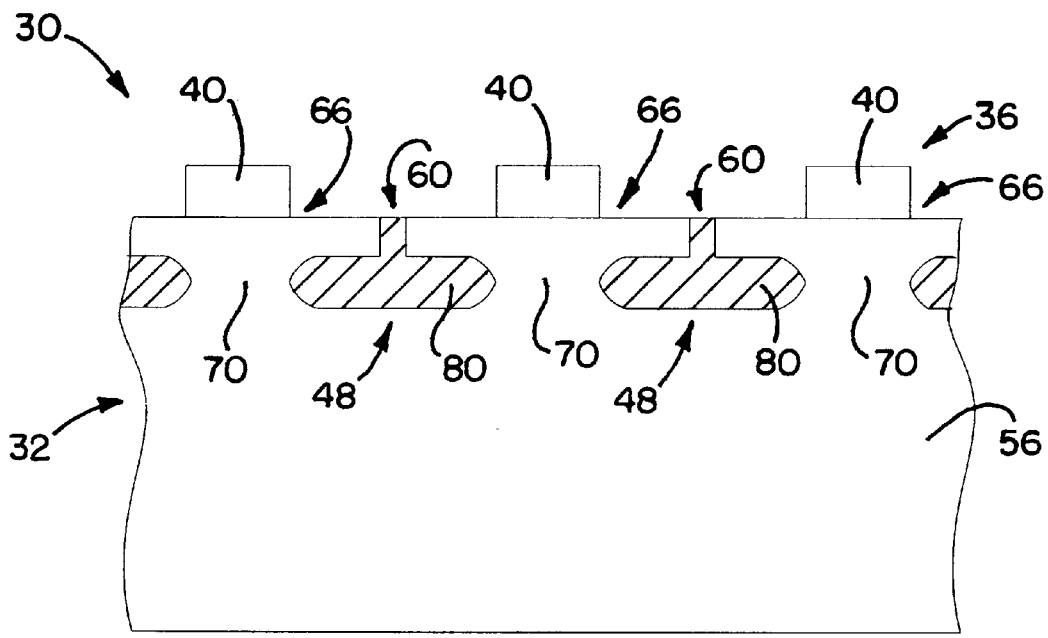
FIG. 8 is a side sectional view illustrating the insulation fill step of the method of FIG. 1.

FIG. 8 illustrates step 20, the filling of the subsurface region 48 and the trenches 60 with an electrically-insulating material 80. An exemplary insulating material is silicon dioxide. It will be appreciated that other electrically-insulating materials may alternatively be employed. The filling may be done by a chemical vapor deposition technique selected to allow conformal filling of the subsurface region and the trenches.

The surface of the electrically-insulating material 80 may be polished after filling to make the surface of the material even with the wafer surface 34.

Figure 9:
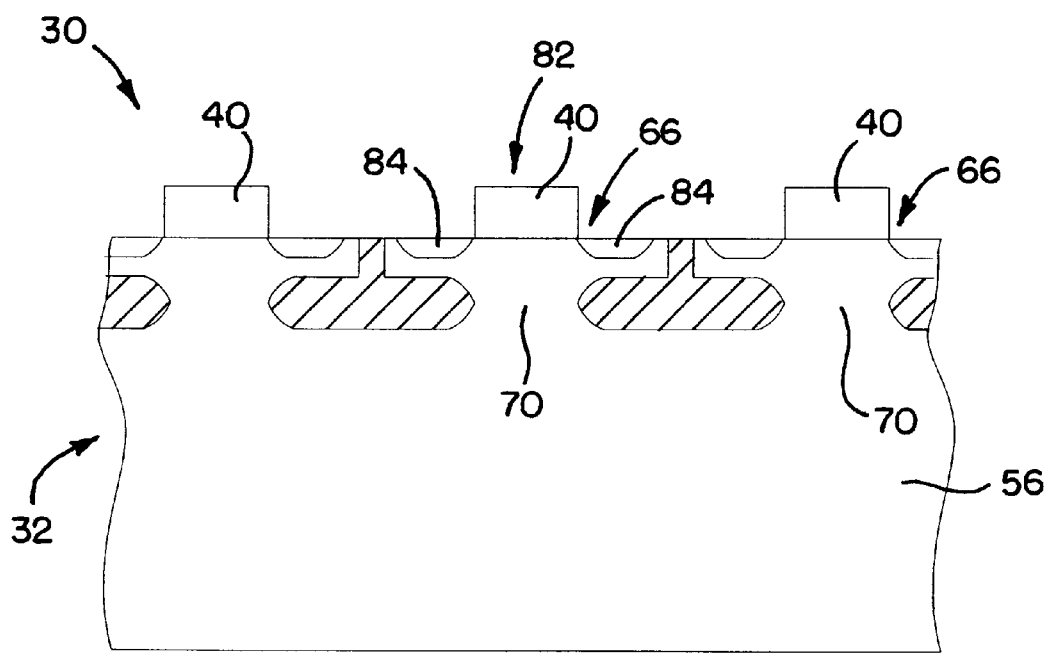
FIG. 9 is a side sectional view showing an electrical device formed on a wafer made in accordance with the method of FIG. 1.

FIG. 9 shows further processing of the semiconductor device 30 to form a MOS transistor 82 on the wafer 32. In forming the transistor 82 wells 84 of a suitably-altered material (e.g., P type silicon) are formed in the semiconductor platform 66 on either side of the electrically active mask element 40. It will be appreciated that the device 30 may be used as a base upon which other electrically active elements may be formed.

It will be appreciated that the resulting semiconductor device shares advantages of both SOI devices and traditional bulk semiconductor wafers. The device of the present invention shares with SOI devices the advantage of electrical isolation, since platforms are well insulated from other platforms due to the presence of the electrically-insulating material in the trenches 60 and the subsurface regions 48. The device 30 shares with traditional semiconductor devices the advantage of avoiding floating body effects, due to the presence of the bridge 70 between the platform 66 and the bulk semiconductor layer 56. Thus the floating body effect which may occur with SOI devices is avoided.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of processing a semiconductor wafer, the method comprising:

forming an altered material in a subsurface region within the wafer;

exposing a portion of the altered material by removing a portion of a surface layer between the subsurface region and a wafer surface to create exposure openings; and selectively removing, through the exposure openings, the altered material from at least a portion of the subsurface region which underlies a remaining portion of the surface layer;

wherein the subsurface region defines a plurality of bridges of semiconductor material each encircled by the subsurface region, each bridge linking an overlying platform of the semiconductor material with an underlying bulk layer of the semiconductor material, thereby providing an electrical link between the platform and the substrate.

2. The method of claim 1, wherein the semiconductor wafer is a silicon wafer.

3. The method of claim 2, wherein the exposing to create the exposure openings includes etching trenches in the surface layer.

4. The method of claim 3, wherein the etching trenches defines a plurality of platforms of semiconductor material each encircled by the trenches.

5. The method of claim 2, wherein the forming the altered material includes implanting below at least a portion of a surface of the wafer a species that promotes selective etching.

6. The method of claim 5, wherein the implanting includes implanting the at least a portion of the surface with ions.

7. The method of claim 6, wherein the implanting with ions includes implanting with ions selected from a group consisting of boron ions, indium ions, gallium ions, and aluminum ions.

8. The method of claim 2, further comprising, prior to the forming the altered material, masking parts of a surface of the wafer to block creation of the altered material outside of the subsurface region.

9. The method of claim 8, wherein the masking includes depositing electrically active elements over the parts for use as a mask.

10. The method of claim 2, wherein the selectively removing includes wet etching the wafer with an etchant that preferentially dissolves the altered material.

11. The method of claim 2, further comprising, after the selectively removing, filling the exposure openings and the at least a portion of the subsurface region with electrically insulating material.

12. A method of forming a semiconductor device, the method comprising:
    depositing an electrically active element on a surface of a semiconductor wafer; and
    forming an altered material in a subsurface region within the wafer, using the electrically active element as a mask to block ion implantation through the portion of the surface covered by the electrically active element.

13. The method of claim 12, wherein the depositing includes depositing an oxide layer on the surface and depositing a conductor layer on the oxide layer.

14. The method of claim 12, further comprising removing the altered material from the subsurface region within the wafer, the altered material having been created by the ion implantation.

15. The method of claim 14, wherein the removing includes creating exposure openings in a layer of the wafer between the surface and the altered material, and selectively removing the altered material through the exposure openings.

16. The method of claim 15, wherein the creating the exposure openings includes creating a trench that surrounds the electrically active element.

17. The method of claim 15, wherein the selectively removing the altered material includes wet etching the wafer with an etchant that preferentially removes the altered material.

18. The method of claim 17, wherein the altered material is removed from underneath a remaining portion of the layer of the wafer.

19. The method of claim 14, further comprising replacing the altered material and filling the exposure openings with an electrically insulating material.

20. The method of claim 11, wherein the electrically active elements include gate electrodes, and further comprising, after the filling, forming a source region and a drain region on opposite sides of respective of the gate electrodes by doping the wafer, using the electrically active elements as a doping mask.

21. The method of claim 12, wherein the electrically active element includes a gate electrode, and further comprising, after the filling, forming a source region and a drain region on opposite sides of the gate electrode by doping the wafer, using the gate electrode as a doping mask.

22. The method of claim 2, wherein each bridge connects to its respective overlying platform at a central region of the platform.

23. A method of processing a semiconductor wafer, the method comprising:
    masking parts of a surface of the wafer by formation of a mask;
    forming an altered material in a subsurface region within the wafer by implantation with ions, using the mask to block creation of the altered material outside of the subsurface region;
    exposing a portion of the altered material by removing a portion of a surface layer between the subsurface region and a wafer surface to create exposure openings; and
    selectively removing, through the exposure openings, the altered material from at least a portion of the subsurface region which underlies a remaining portion of the surface layer;
    wherein the subsurface region defines a plurality of bridges of semiconductor material each encircled by the subsurface region, each bridge linking a central region of an overlying platform of the semiconductor material with an underlying bulk layer of the semiconductor material, thereby providing an electrical link between, the platform and the substrate.

* * * * *